Sept. 19, 1967 W. H. MILLER ET AL 3,343,049
SEMICONDUCTOR DEVICES AND PASSIVATION THEREOF
Filed June 18, 1964 3 Sheets-Sheet 1
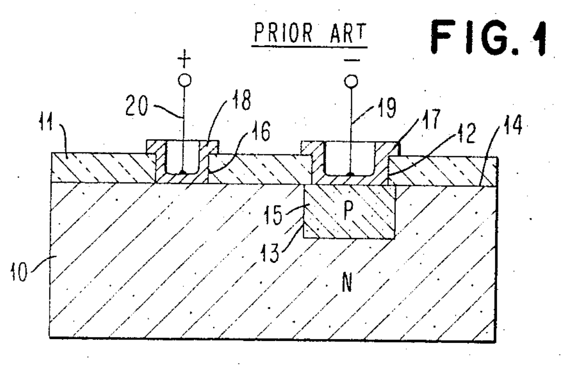
PRIOR ART FIG. 1
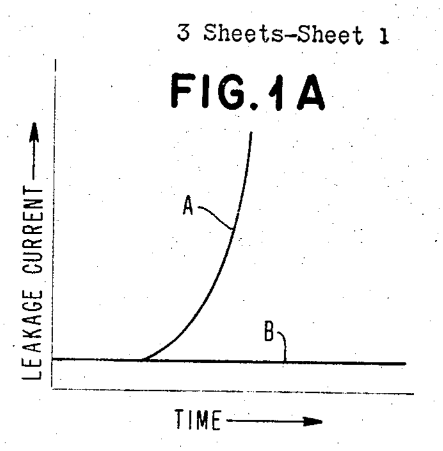
FIG. 1A
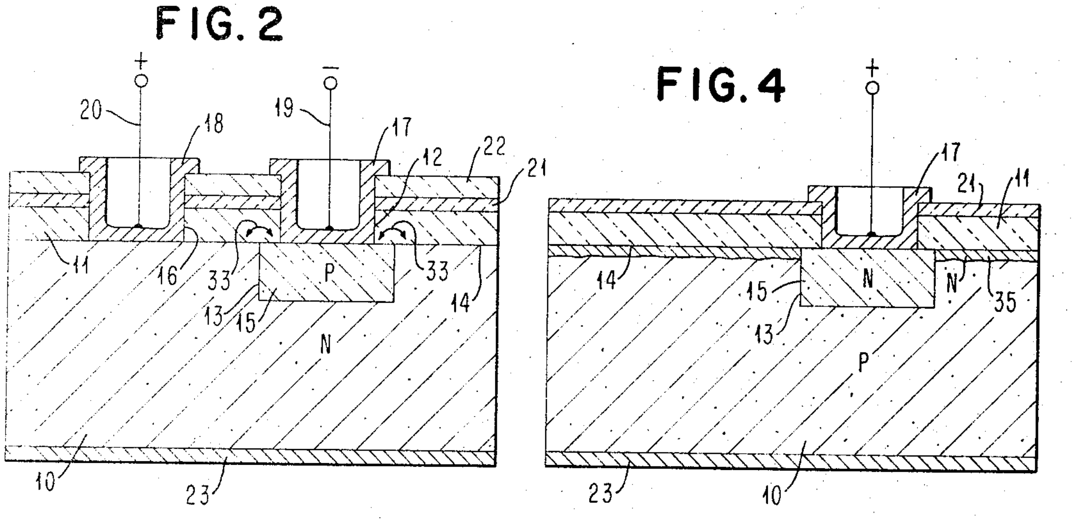
FIG. 2, FIG. 4
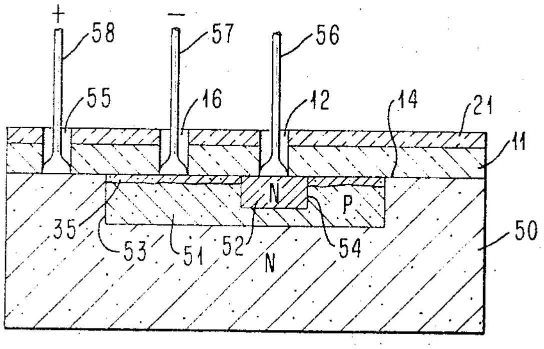
FIG. 5
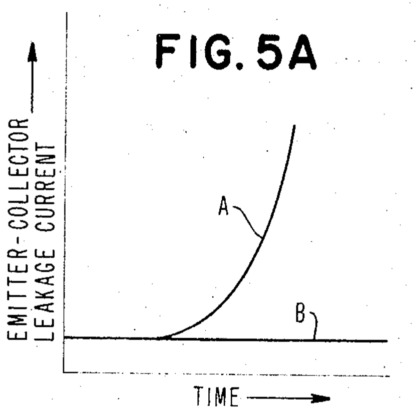
FIG. 5A
INVENTORS
WILLIAM H. MILLER
FRED. BARSON
BY Everett A. Gartrell
ATTORNEY United States Patent Office 3,343,049
Patented Sept. 19, 1967

3,343,049
SEMICONDUCTOR DEVICES AND PASSIVATION THEREOF

William H. Miller, Poughkeepsie, and Fred Barson, Wappingers Falls, N.Y., assignors to International Business Machines Corporation, New York, N.Y., a corporation of New York Filed June 18, 1964, Ser. No. 376,066
14 Claims. (Cl. 317—234)

The present invention is directed to semiconductor devices and the passivation thereof. More particularly, the invention relates to the method of improving at least one electrical quality of semiconductor devices such as their stability over an extended period of operation, reduction in leakage current over such a period, and increase in reverse-voltage breakdown and performance.

In the manufacture of semiconductor devices today, there is a pronounced trend toward devices which include one or more PN junctions that come to a surface thereof and have a passivating layer of insulating material covering the exposed junction or junctions thereof and the surface region adjacent thereto. Planar semiconductor devices of a material such as silicon which employ a silicon dioxide passivating layer are typical. While not limited to such devices, the invention will in general be described in that environment.

Various types of semiconductor devices such as capacitors, diodes and transistors including those of the insulating-gate field-effect type experience undesirable shifts in one or more of their operating characteristics or qualities at medium and high operating temperatures when operated under their usual bias conditions for periods of time. For many applications, such shifts are most undesirable and have not been readily correctible.

It is an object of the present invention, therefore, to provide a new and improved semiconductor device which avoids one or more of the shortcomings of prior such devices.

It is another object of the invention to provide a new and improved semiconductor device which demonstrates stable operating characteristics over extended periods of operation.

It is a further object of the invention to provide a new and improved method of improving stability of a semiconductor device, which method is inexpensive and relatively easy to practice.

It is yet another object of the present invention to provide a new and improved method of decreasing the leakage current of semiconductor diodes and transistors which are operated for extended periods of time.

It is an additional object of the invention to provide a new and improved semiconductor capacitor.

In accordance with a particular form of the invention, in the fabrication of an electrical device which includes a semiconductor member and an oxide surface layer, the method of improving the electrical stability of the device comprises forming and maintaining on the aforesaid layer in intimate engagement therewith a vitreous film of a mixture of the aforesaid oxide layer and phosphorus pentoxide.

Also in accordance with the invention, an electrical device comprises a semiconductor member, an oxide surface layer, means coupled to the device for producing an electric field in the aforesaid member and layer, and a vitreous film of a mixture of the oxide layer and phosphorus pentoxide in intimate engagement with the aforesaid layer in the region of the field in the layer for improving an electric quality of the device.

The foregoing and other objects, features and advantages of the invention will be apparent from the following more particular description of preferred embodiments of the invention, as illustrated in the accompanying drawings.

In the drawings:

FIGS. 1 and 1A are, respectively, a sectional view and an operating characteristic of a semiconductor diode in accordance with the prior art;

FIGS. 2 and 2A–2H are sectional views illustrating a semiconductor diode and steps in the fabrication thereof in accordance with the present invention;

FIG. 3 is a diagrammatic representation of a diffusion operation employed in one of the steps in fabricating the device of FIG. 2;

FIG. 4 is a sectional view of a semiconductor diode in accordance with another embodiment of the invention;

FIGS. 5 and 5A are respectively, a sectional view and an operating characteristic of a transistor constructed in accordance with one form of the present invention;

DESCRIPTION OF PRIOR-ART STRUCTURE OF FIG. 1

Figure 2A:
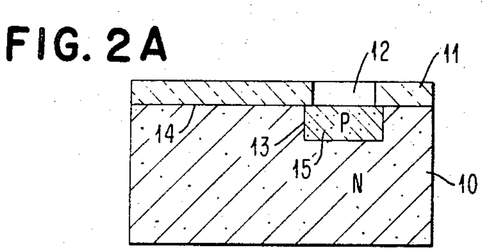
Figure 2F:
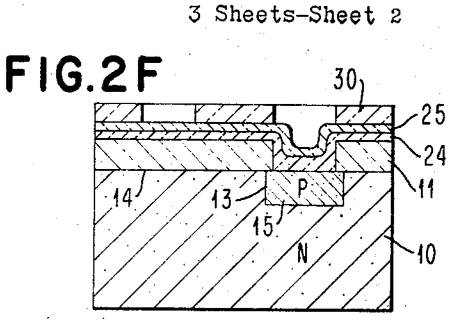
Figure 2B:
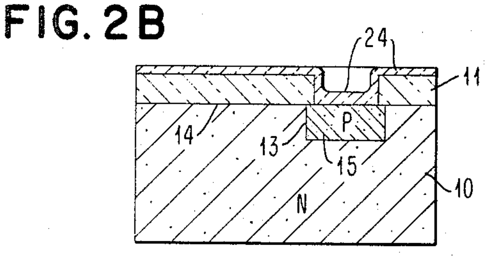

In order to understand more fully the various advantages of the methods and the semiconductor devices of the present invention, it will be helpful to consider first the fabrication of a semiconductor diode in accordance with the prior art and an operating quality or characteristic thereof. The diode represented in FIG. 1 includes a semiconductor wafer or member 10 of a suitable material such as N-type germanium, silicon or an intermetallic semiconductor compound. For the purpose of this description and those which follow, it will be assumed that the various semiconductor members are silicon. Ordinarily several hundred diodes are made on a single silicon substrate and, when their fabrication is complete they are severed into individual devices. However, to simplify the description, the fabrication of but a single device will be considered herein. The member 10 has a continuous layer 11 of a silicon oxide coating formed thereon integral with its upper surface. To that end, the layer 11 may be a genetic layer formed from the parent member 10 by means other than simply exposing the body to the atmosphere. This layer may be derived from member 10 by heating the latter between 900–1040° C. in an oxidizing atmosphere saturated with water vapor or steam. Patent 2,802,706 to Derick et al., granted Aug. 14, 1957 and entitled "Oxidizing of Semiconductor Surfaces for Controlled Diffusion" describes one such treatment. Although the exact chemical composition of the oxide layer is not known, it is believed to be primarily silicon dioxide.

Alternatively, an inert adherent coating or layer which is believed to be mostly silicon dioxide may be formed on the surface of the semiconductor member 10 by heating the latter in the vapors of an organic siloxane compound at a temperature below the melting point of the member but above that at which the siloxane decomposes, so that an inert layer of silicon dioxide coats the desired surface. For example, member 10 may be heated for 10–15 minutes at approximately 700° C. in a quartz furnace containing triethoxysilane, using argon or helium as the carrier gas to sweep the siloxane fumes through the furnace. Since experience has indicated that silicon dioxide films made by the thermal decomposition of an organic siloxane compound are somewhat less dense than those grown in an oxidizing atmosphere, a somewhat thicker film of the former is ordinarily employed. Such films are, however, particularly advantageous for application to materials such as germanium for the purposes under consideration. Patent 3,089,793 to Eugene L. Jordan and Daniel J. Donohue, granted May 14, 1963 and entitled "Semiconductor Devices and Methods of Making Them" describes procedures for making such layers, removing selective portions thereof, and diffusing conductivity-directing impurities through the openings established in those films to form PN junctions.

An aperture 12 is formed at a predetermined location in the layer 11 by conventional photoengraving techniques. In a manner well known in the art, a photoengraving resist (not shown) is placed over the silicon dioxide layer 11 and the resist is then exposed through a master photographic plate having an opaque area corresponding to the regions where the oxide layer is to be removed. In the photographic development, the unexposed resist is removed and a corrosive fluid is employed to remove the oxide layer from the now exposed regions while the developed resist serves as a mask to prevent the chemical etching of the oxide area that is to remain on the semiconductor member 10.

In the next operation, a PN junction 13 is created in the member 10, which junction extends to the upper surface 14 of that member. This is accomplished by a conventional diffusion operation wherein a suitable conductivity-determing impurity such as boron passes through the aperture 12 and diffuses into the member 10 to establish a P-type region 15 of a conductivity type opposite that of the member 10 and to create the PN junction 13. The elevated temperature of the diffusion operation does not damage the silicon dioxide layer 11, which preferably has a thickness of about 5000–6000 angstroms. A film of such thickness is impervious to the diffusing material and hence serves as a passivating and diffusion mask that confines the diffusion to a predetermined area on the surface of the member 10. It will be observed that in the diffusion operation, the impurity creeps or diffuses for a short distance under the etched portions of the silicon dioxide layer 11 which defines the aperture 12. The oxide layer over the junction 13 where it comes to the surface 14 protects the junction against contamination.

In a subsequent operation, an aperture 16 is opened in the layer 11 in the same manner as for the aperture 12. Thereafter ohmic contacts 17, 18 are applied to the exposed surfaces of the member 10 and the region 15 by well-known evaporation techniques, and these contacts may be alloyed with the semi-conductor material thereunder. Suitable means such as the connections 19, 20, represented diagrammatically in the drawing, may be made to the contacts 17, 18 when required for some applications.

OPERATION OF SEMICONDUCTOR DIODE OF FIG. 1

In considering the operation of the prior art semiconductor diode of FIG. 1, it will be assumed that the device will be operated for a period of time at least sufficient for it to reach its normal operating temperature and that it has a typical reverse bias applied to its PN junction 13. Curve A represents the manner in which the leakage current at the surface 14 of the diode varies with time. It will be seen that the leakage current is initially relatively low and then, sometime after the diode has reached its operating temperature, the leakage current begins to increase gradually and thereafter rises abruptly to a high value. The reason for the existence of this sudden substantial increase in leakage current is not fully understood. It is believed that the electric field established in the semiconductor material and in the silicon dioxide layer 10 in the vicinity of the PN junction 13 where it comes to the surface 14 establishes an interface potential which is unstable with time under conditions of the usual operating temperatures and bias. It has also been observed that the reverse-voltage breakdown of the diode decreases concurrently with the increase in leakage current. It will be manifest that this material increase in leakage current is undesirable for those applications wherein stability with reference to the leakage current and the junction breakdown voltage is important.

DESCRIPTION OF SEMICONDUCTOR DIODE OF FIG. 2

Referring now more particularly to the semiconductor diode of FIG. 2 which is constructed in accordance with one form of the invention, the device there represented is generally similar to the prior art diode of FIG. 1, but has important differences to be mentioned subsequently. Accordingly, corresponding elements in the two figures are designated by the same reference numerals. The FIG. 2 diode comprises a semiconductor wafer or member 10 which may also be of a suitable material such as N-type germanium, silicon or an intermetallic semiconductor compound. Member 10 has a continuous layer 11 of silicon oxide contiguous with at least a surface portion, that is the upper surface portion 14 of the member. This layer may be formed in a manner explained above in connection with FIG. 1. The P-type region 15 and the PN junction 13 are created in the semiconductor member 10 in the manner previously explained in connection with FIG. 1 and will not be repeated.

In accordance with a feature of the present invention, there is formed and maintained on the layer 11 in intimate engagement therewith a vitreous film 21 of a mixture of the oxide layer 11 and phosphorus pentoxide. The manner in which this film is applied will be explained subsequently.

For some applications such as those wherein the diode is to be operated in a humid environment or in one which may contain noxious vapors, it may be desirable to cover the film 21 with a thin protective coating 22 of glass. Such a coating is preferably laid down in a manner disclosed in and claimed in U.S. Patent 3,212,921, Ser. No. 141,668, filed Sept. 29, 1961, in the name of William A. Pliskin and Ernest E. Conrad, entitled "Method of Forming Glass Film on Object and Product Produced Thereby," and assigned to the same assignee as the present invention. Briefly, this is accomplished by a sedimentation operation wherein a colloidal suspension of finely divided glass particles in a liquid vehicle having a dielectric constant in the range of about 3.5–20.7 is centrifuged so as to dispose a layer of the glass particles on the exposed surface of film 21. Thereafter the particles are heated to their softening point to fuse them into a thin hole-free glass coating having a thickness such as a fraction of a micron to several microns. The apertures 12 and 16 are then reestablished with a glass etchant through the glass coating 22 and the film 21, and then the electrodes 18 and 19 are made to the exposed portions of the P-type and the N-type regions 15 and 14. If desired, in lieu of the electrode 18 on the upper surface 14 of the member 10, an electrode 23 may be formed in a conventional manner as by evaporation on the under side of the member 10 to form an ohmic connection thereto.

The manner in which the semiconductor diode of FIG. 2 is fabricated will be explained in greater detail in connection with FIGS. 2A–2H. As has been explained above, the P-type member 15 and junction 13 of FIG. 2A are established in the N-type member 10 by diffusing a suitable significant impurity such as boron through the aperture 12 in the conventional silicon oxide film 11. Thereafter a silicon oxide layer 24 is reformed on at least the exposed P-type member 15 by techniques previously explained. Ordinarily layer 24 is also formed to extend over the upper surface of the layer 11 and has a thickness over the P-type region 15 which is approximately that of layer 11 so that it is capable of serving as a diffusion mask against an N-type diffusant. In the next operation, vitreous film 25 of a mixture of silicon oxide and phosphorus pentoxide is formed on the reformed layer 24.

The phosphorus pentoxide for forming the film 25 may be produced in a number of ways. In general, a number of known phosphor compounds such as phosphine ($PH_3$) and phosphorus oxychloride ($POCl_3$) may be decomposed in an oxidizing environment in a manner well-known in the art in a dynamic reactor system maintained at an elevated temperature to produce phosphorus pentoxide in a gaseous state for diffusion into the silicon oxide layer 24. A dynamic system such as that represented diagrammatically in FIG. 3 may also be employed. The system there represented includes a source of an inert carrier gas such as nitrogen or a mixture of nitrogen and argon for transporting a phosphorus pentoxide vapor produced in a supply chamber 26 maintained at a temperature about 200° C. and delivered to a reaction chamber 27 held at a higher temperature such as one in the range of 900–1100° C. While the temperature range just indicated has been employed for use in reaction chamber 27 with silicon devices, it will be understood that for other semiconductor materials the temperatures may differ therefrom somewhat. Chamber 26 includes an open container 28 containing powdered phosphorus pentoxide which is converted to a vapor and carried by the inert gas into the chamber 27. The latter includes a support 29 for the PN junction diode which is maintained in the stream of the phosphorus pentoxide vapor. The time the semiconductor diode remains in the reaction chamber 27 and the temperature of the latter denpends upon the thickness that one desires to obtain for the film 25. A time of about 1 hour has proved to be suitable for silicon diodes. When phosphine is decomposed to produce the film, a time of about 7 minutes may be satisfactory.

Figure 2G:
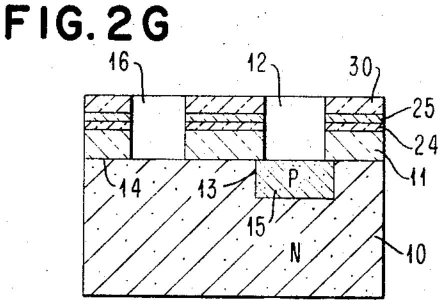
Figure 2C:
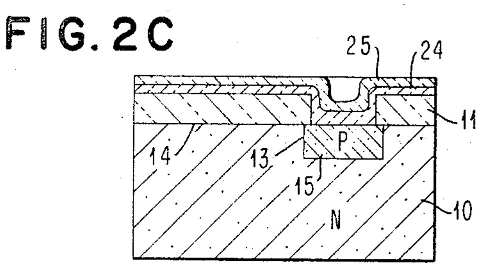

The thickness of the film 25 may be one in the range of about 500–5,000 angstroms, 4,000 angstroms being a thickness which has been employed to advantage. The film 25 not only appears to build up on the silicon oxide layer 24 but the phosphorus pentoxide vapor is believed to penetrate into that layer somewhat and change the composition of its outer surface. The vapor does not pass through the layer 24, however. Infra-red spectroscopy, etch-rate studies and chemical analysis show that the film 25 is $P_2O_5.SiO_2$, which is sometimes referred to more generally by workers in the semiconductor art as a phospho-silicate glass. In the next operation, a photoengraving resist 30 shown in FIG. 2D is formed on the vitreous film 25 in a manner well known in the art. Thereafter the resist is exposed through a master photographic plate (not shown) having opaque areas corresponding to the regions from which predetermined parts of the vitreous film 25 and the silicon oxide layers are to be removed. The shaded areas of FIG. 2E illustrate the unexposed areas 31 and 32 of the resist 26. In the photographic development, the unexposed areas are removed with a conventional stripping material or fluid to leave the apertured film 30 represented in FIG. 2F. The developed resist serves as a mask to prevent unwanted subsequent chemical etching of the vitreous film and silicon oxide areas that are to remain on the silicon device. Next apertures 12 and 16 (see FIG. 2G) are etched in the vitreous film 25 and the silicon oxide layer 24 to expose predetermined portions of the surface 14 of the N-type member 10 and the P-type member 15. A buffered hydrofluoric acid solution may be employed for this purpose. A solution which is made from 1 pound of ammonium fluoride and 680 cc. of water, and which then is used in the ratio of about 7 parts thereof to 1 part of hydrofluoric acid has proved to be a satisfactory buffered hydrofluoric acid solution for etching selected portions of the film 25 and the layer 24.

Figure 2H:
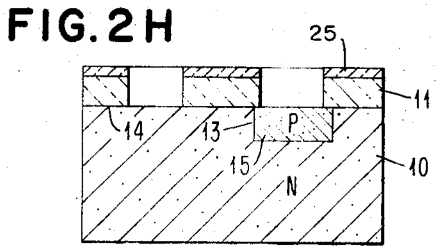
Figures 2D, 2E, 3:
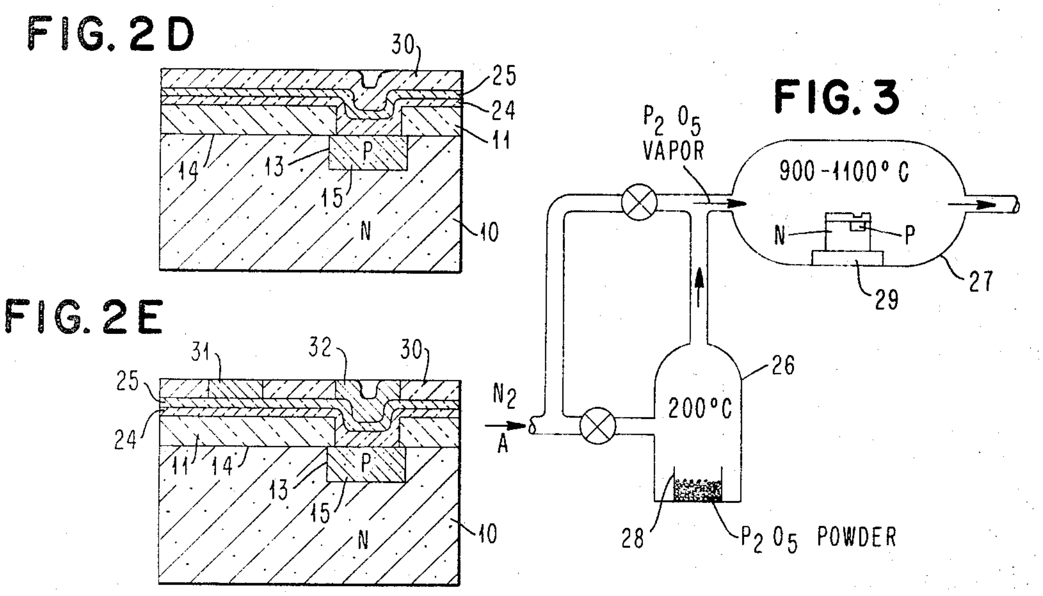

In the next operation the remaining photoengraving resist 26 is removed in a conventional manner with a corrosive fluid to leave the structure shown in FIG. 2H. Since the two silicon oxide layers 11 and 24 of FIG. 2G are effectively a single layer, they have been represented in FIG. 2H as a single layer 11, corresponding to the layer 11 of FIG. 2. The corrosive fluid used in stripping the photoengraving resist may sometimes leave an undesirable oxide film partially covering the exposed portion of the upper surface 14 of the device. This film may be removed by immersing the diode for short periods such as for 10–15 seconds in a suitable solution such as the buffered-hydrofluoric acid solution mentioned above. Care must be taken and the period so selected that the $P_2O_5.SiO_2$ vitreous film 25 definitely is not removed, otherwise the important benefits imparted by that film during the operation of the device cannot be obtained. In a subsequent procedure, electrodes 19 and 18 (see FIG. 2) are applied to the exposed upper surface of the members 15 and 10 in a conventional manner. The use of the glass coating 22 is optional as has been previously stated.

EXPLANATION OF OPERATION OF SEMICONDUCTOR DIODE OF FIG. 2

In considering the operation of the diode of FIG. 2, it will be assumed that the connections 19 and 20 are connected to a suitable means for reversely biasing the PN junction 13 in the usual manner, thereby producing an electric field in the semiconductor members and the silicon oxide layer 11 of the device. This region is identified by the curved arrows 33, 33 in FIG. 2. It is believed that a charge build-up occurs at the interface of the semiconductor material and the silicon oxide layer 11 in the region of the field identified by the arrows which causes the interface potential in that region to be unstable under conditions of operating temperature and bias. The cause of this instability and explanation of the manner in which the $P_2O_5.SiO_2$ film 21 corrects this difficulty is complex and is not clear. It has been determined, however, that semiconductor devices made so as to have the vitreous film 21 of $P_2O_5.SiO_2$ over the silicon oxide film 11 in the region of the electric field identified by the arrows materially improves at least one electrical quality of the devices. A significant enhancement of the stability and the breakdown voltage of a semiconductor diode results through the use of the film 21 in the region just mentioned or over the entire surface of the oxide layer 11. As previously stated, Curve A of FIG. 1A represents the effect of time on the leakage current of a semiconductor diode in accordance with the prior art which is reversely biased in the usual manner and is operating at its normal operating temperature. That curve shows a big increase in leakage current after the device has been in operation for a period of time. Curve B, on the other hand, represents the corresponding variation in leakage current of the semiconductor diode of FIG. 2 constructed in accordance with the present invention. It will be seen that the leakage current remains at a low substantially constant value over an extended period of time. This reduction in leakage current is also accompanied by a desirable increase in the reverse-voltage breakdown of the junction 13. Experience has indicated that many prior-art semiconductor diodes of the type represented in FIG. 1 exhibit instability at operating temperatures around 150° C. whereas diodes of the type represented in FIG. 2 containing the vitreous film 21 were stable over extended periods of time at temperatures as high as 300° C.

The present understanding of the electrical behavior of semiconductor devices which include a silicon oxide passivating layer 11 is based on the concept that the device instabilities which occur are due to the motion of oxygen ions into oxygen ion vacancies in the silicon oxide layer. There is a net positive charge associated with these vacancies. The vacancies may be regarded as moving to the interface of the silicon oxide layer 11 and the semiconductor material, and, when they do so, they attract more electrons. This causes the surface conductivity of the semiconductor material to become more N-type. When a vitreous $P_2O_5 \cdot SiO_2$ film 21 is applied to the outer surface of the silicon oxide layer 11 as represented, the phosphorus pentoxide in the film acts as an oxidizing agent for the reduced silicon dioxide and the vacancies are eliminated. This in turn produces a significant improvement in device stability.

DESCRIPTION OF SEMICONDUCTOR DIODE OF FIG. 4 AND OPERATION THEREOF

FIG. 4 is a sectional view of a semiconductor diode which is a modification of the one represented in FIG. 2, corresponding elements of the two figures being designated by the same reference numerals. The FIG. 4 diode differs from that of FIG. 2 primarily in that the wafer or member 10 is a P-type silicon while the members 15 is N-type silicon. In the fabrication of the diode including the step of forming the passivating silicon oxide layer in the manner previously explained, there unavoidably results an undesired surface inversion phenomenon which manifests itself as a very thin N-type layer 35 at the surface 14 of the P-type region 10. Such an inversion layer may arise from the entry of spurious donors into the semiconductor member 10 as a result of induced charges from ions or trapped charges on or near the surface of the semiconductor member. This inversion layer 35 impairs the electrical characteristics of the diode, fosters unreliable performance thereof by increasing leakage currents, by adding undesirable capacitance and causing the PN junction 13 to extend out to the sides of the member 10 where it is unprotected by the passivating silicon oxide layer 11. It will be seen that such an inversion layer constitutes a leakage path for current to flow from the N-type member 15 through the inversion layer 35 to the unprotected and hence unreliable junction at the side of the device and from thence to the P-type region 10 thereof. During operation of the reversely biased diode, the vitreous film of $P_2O_5 \cdot SiO_2$ is effective to offset or minimize these shortcomings.

In the FIG. 4 device, the vitreous film 21 may be established on the silicon oxide masking film 11 during the diffusion operation in which the N-type region is being formed providing a phosphorus-containing compound capable of supplying phosphorus pentoxide vapor which is employed as the impurity source. Phosphine, phosphorus oxychloride or a phosphorus pentoxide powder may constitute the source of the phosphorus pentoxide vapor in the manner known in the art. The photoengraving resists and precedures considered in connection with FIGS. 2D–2F may be omitted in the fabrication of the semiconductor diode of FIG. 4, providing ample care is employed after the diffusion operation in cleaning off the portion of the N-type region 15 to expose that portion of the surface which is to receive the electrode 17. To that end, the film 21 preferably should have an adequate thickness such as about 4000 angstroms and the immersion in the buffered hydrofluoric etching bath or other suitable solution for a period such as 10–15 seconds to clean the exposed surface of member 15 should leave most of the film 21 intact over the rest of the silicon oxide layer 11. Connections to the P-type region 10 may be made by the electrode 23 on its lower surface.

The action of the vitreous film 21 on the operation of the diode of FIG. 4 is considered to be similar to that explained above in connection with the FIG. 2 device. The N-type inversion layer 35 is believed to be interrupted or the induced negative charges associated therewith are displaced down into the bulk of the P-type semiconductor member 10 so that layer 35 no longer exists as a true surface layer or state to impair the electrical quality of the diode. Accordingly, the diode has the leakage current-time characteristic represented by curve B of FIG. 1A, a reduced capacitance in relation to that of a similar device lacking the vitreous film 21, a high reverse-voltage breakdown, and a fully passivated PN junction.

DESCRIPTION OF TRANSISTOR OF FIG. 5 AND EXPLANATION OF OPERATION THEREOF

Referring now to FIG. 5 of the drawings, there is represented a transistor such as one of the planar type which has constructional features similar to those of the semiconductor diodes of FIGS. 2 and 4. Accordingly, corresponding ones of the various elements are designated by the same reference numerals. The transistor includes a first semiconductor member 50 of one conductivity type. While this may be a suitable semiconductor material, for the purposes of the present description it will be considered to be N-type silicon. The transistor also includes a second semiconductor member 51 of the opposite or P-type nested in the semiconductor member 50 and defining a PN junction 53 therewith. The device further includes a third semiconductor member 52 of the one or N-conductivity type nested in member 51 and defining a PN junction 54 therewith. The members 50, 51 and 52 have a coplanar surface 14 and the junctions 53 and 54 extend to that surface. It will be seen that the members 50, 51 and 52 constitute the collector, base and emitter regions, respectively, of the transistor and that junctions 53 and 54 form the collector-base and the base-emitter junctions of the device.

A passivating oxide layer of a material such as silicon oxide covers the junctions, is contiguous with the coplanar surface 14 and has spaced apertures 12, 16 and 55 therein exposing predetermined portions of the members 50, 51 and 52. Formed on the silicon oxide layer 11 in a manner such as that explained above in connection with the semiconductor diodes is a vitreous film 21 of a mixture of the oxide of layer 11 and phosphorus pentoxide. The apertures just mentioned also extend through the film 21 and permit the attachment of conventional emitter, base and collector electrodes 56, 57 and 58 to the exposed surfaces of the members 52, 51 and 50, respectively. In the fabrication of the transistor, there unavoidably results on the P-type member 51 or base region an undesired very thin surface inversion layer 35 of N-type semiconductor material corresponding to the layer 35 of FIG. 4. It will be seen that this inversion layer creates an undesirable leakage path or channel across the base member 51 for current to flow between the N-type emitter member 52 and the N-type collector member 50. In the absence of the vitreous film 21, this leakage current increases with the time of operation of the transistor in the manner represented by Curve A of FIG. 5A.

To operate the transistor, it is connected in circuit and biased in a conventional manner. The action of the vitreous film 21 on the top of the silicon oxide layer 11 counteracts the effect of the surface inversion layer 35, reduces the emitter-collector leakage current of the transistor so that over a period of time it has the characteristic represented by Curve B of FIG. 5A. A reduction in the leakage current also serves to improve other transistor parameters elated to leakage current. The reverse-voltage breakdown of the junction is increased along with the current gain or alpha of the transistor. Transistors of the type represented in FIG. 5 and also similarly passivated planar PNP transistors employing a vitreous film of the type under consideration have demonstrated significant improvements such as those just mentioned at operating temperatures which may run at least as high as 200° C.

Figure 6:
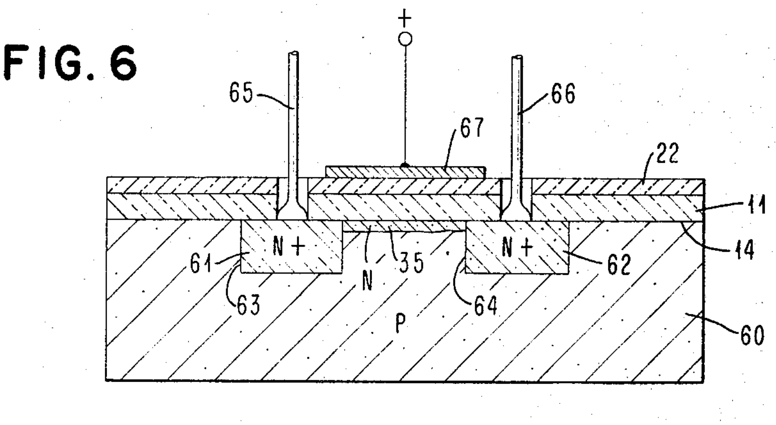
FIGS. 6 and 6A are, in the order named, a sectional view and an operating characteristic of a field-effect transistor in accordance with the present invention.

DESCRIPTION OF FIELD-EFFECT TRANSISTOR OF FIG. 6 AND EXPLANATION OF OPERATION THEREOF

Referring now to FIG. 6, there is represented an insulated-gate field-effect transistor in accordance with the present invention. That device includes a first semiconductor member 60 such as silicon of the one or P-conductivity type and spaced second and third members 61 and 62 of the opposite or N-conductivity type disposed in member 60 as by a diffusion operation and defining PN junctions 63 and 64 with that member. The various members have a coplanar surface 14 and the junctions 63 and 64 extend to that surface. Convention source drain connections 65 and 66 are made to members 61 and 62. A passivating oxide layer 11 covers the junctions where they extend to the surface 14 and also is contiguous with that surface. A vitreous film 22 of the material described above in connection with the diodes and transistors of FIGS. 2, 4 and 5 is maintained on the layer 11 at least between the spaced members 61 and 62. Ordinarily it is somewhat simpler from a fabrication standpoint to apply the film 22 over the entire oxide layer 14 as represented. An area-type gate electrode 67 is applied to the film 22 between the members 61 and 62.

Figure 6A:
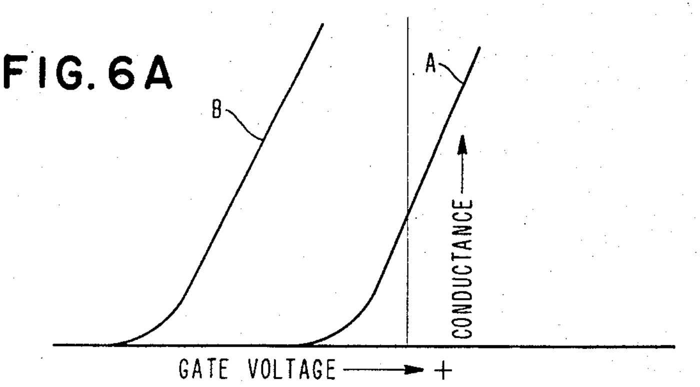

The positive bias applied to the gate electrode 67 creates an inversion layer or channel 35 on the surface of the P-type member between the spaced N-type members 61 and 62. During operation of the device, current flow is through this channel, the thickness of which is modulated in the well known manner by variations in the magnitude of the voltage applied to the gate electrode 67. In the absence of the vitreous film 22, when such a transistor is operated at medium or high temperatures (such as in the range of 80–150° C.) under the usual operating-bias conditions, undesirable shifts in the operating characteristic of the device result. For example, the gate voltage-conductance characteristic initially may be that represented by Curve A of FIG. 6A, but will shift to the left to the position represented by Curve B. Elimination of this shift to assure a stable device characteristic is most desirable. Assuming that the resistance of the channel 35 at a predetermined gate voltage initially is 10 units but decreases to 5 units after an extended period of operation, it will be appreciated that this 50% change in the conductance of the channel will materially alter the operation of the transistor.

The presence of the viterous film 22 on the silicon oxide layer 11 stabilizes the operating characteristic of the transistor by maintaining the conductance-gate voltage curve in the position represented by Curve A despite operation for extended periods of time at medium or high temperatures. A representative field-effect transistor employs a 7 ohm cm. P-type member 60, N-type diffused members 61 and 62 having a depth of 2 microns and a spacing of several tenths of a mil, a 1500 angstrom silicon oxide layer 21 and a 500 angstrom vitreous film 22. The latter may be created by a diffusion operation using a phosphorus pentoxide impurity source in a reaction chamber that is maintained at about 1050° C.

Figure 7:
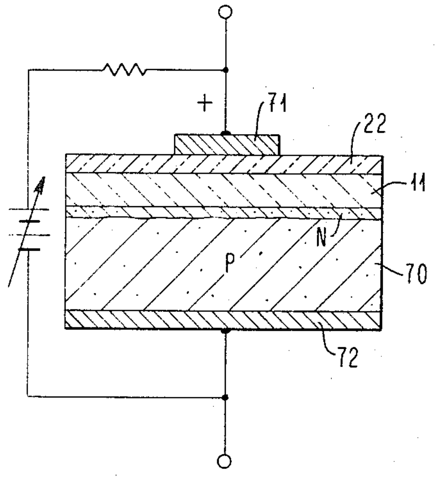
FIGS. 7 and 7A are, respectively, a sectional view of a semiconductor capacitor in accordance with the invention and an operating characteristic thereof.
Figure 7A:
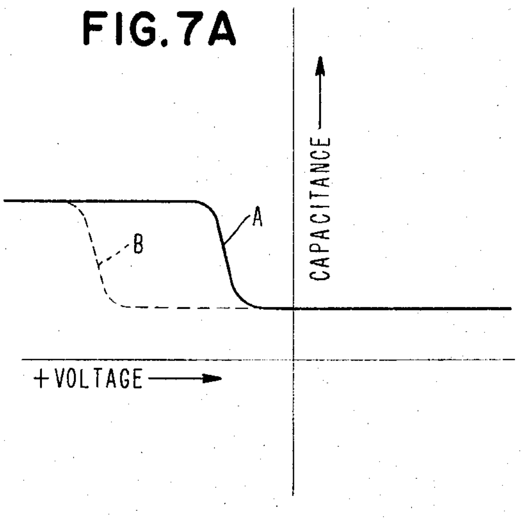

DESCRIPTION OF SEMICONDUCTOR CAPACITOR OF FIG. 7 AND EXPLANATION OF OPERATION THEREOF

One form of a voltage-sensitive semiconductor capacitor in accordance with the present invention is represented in FIG. 7. It includes a P-type semiconductor member 70 of a material such as silicon, a silicon oxide layer 11 contiguous with the surface portion of that member, and a vitreous film 22 of a mixture of the oxide layer and phosphorus pentoxide maintained in intimate engagement with the layer 11. The silicon oxide layer and the vitreous film are formed in the manner previously explained. The semiconductor 70 may have a suitable thickness such as about 5 mils and a resistivity such as 2–5.5 ohm cm. Higher resistivity silicon members such as the one just mentioned provide voltage-sensitive capacitors which exhibit greater capacitance swings for changes in applied voltage. The silicon oxide layer 11 may have a thickness of a few thousand angstroms such as 2000–5000 angstroms, while the thickness of the vitreous film may be from about 500–4000 angstroms. A first electrode 71 is applied in a conventional manner to the film 22 while a second electrode 72 is applied to the semiconductor member 70. The capacitance resulting between those electrodes exhibits desirable temperature-bias stability as will be explained subsequently.

A semiconductor capacitor similar to the one described above but lacking the important vitreous film 22, when operated with a positive bias of the order of 10–30 volts on its electrode 71, as is desired for many applications, would lack temperature-bias stability over the range of operating temperatures. For example, when such device had been in operation for a period of time, the temperature thereof would shift its capacitance-voltage characteristic from that represented by the full line Curve A to the broken-line Curve B. For some devices, this has represented a voltage shift as much as 200 volts. The reason for this instability is not understood and is not encountered with a negative bias on the electrode 71. Such a change in characteristic indicates that the device lacks adequate temperature-bias stability when operated with a positive bias on its electrode 71. For many applications, a shift in the capacitance of the device (without an intentional change in the bias voltage) would be most undesirable. However, the presence of the vitreous film 22 in accordance with the present invention acts, in a manner believed to be related to oxide ion vacancies in the silicon oxide layer 11, to prevent the shift in characteristic. Thus the device retains the characteristic represented by Curve A. Stability at operating temperatures in the range of 25–300° C. has been experienced with silicon capacitors of the type under consideration.

While a semiconductor capacitor employing a P-type material has been described, similar benefits are obtained when the semiconductor member 70 is N-type material.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device comprising:
a semiconductor member;
an insulating layer coterminous with and located on a surface portion of said member;
means coupled to said device for producing an electric field in said member and said layer; and
means for improving the stability of said device comprising a passivating vitreous film disposed on and coterminous with said layer, said film consisting of an oxide and phosphorous pentoxide.

2. A semiconductor device comprising:
a semiconductor member;
an oxide layer coterminous with and located on one surface of said member;
means coupled to said device for producing an electric field in said member and said layer; and
means for improving the stability of said device comprising a passivating vitreous film disposed on and coterminous with said layer, said film consisting of an oxide and phosphorous pentoxide.

3. A semiconductor device comprising:
a semiconductor member;
an oxide layer located on one surface of said member;
electrodes on said device for applying a voltage thereto to produce an electric field in said member and said layer; and
means for improving the stability of said device comprising a passivating vitreous film disposed on and coterminous with said layer, said film consisting of an oxide and phosphorous pentoxide and having a thickness of about 500–5000 angstroms.

4. A semiconductor device comprising:
a silicon semiconductor member;
a silicon dioxide layer contiguous with at least one surface of said member;
means coupled to said device for producing an electric field in said member and said layer; and
means for improving the stability of said device comprising a passivating vitreous film disposed on and coterminous with said layer, said film consisting of an oxide and phosphorous pentoxide and having a thickness of about 500–5000 angstroms.

5. A transistor comprising:
a first semiconductor member of one conductivity type;
a second semiconductor member of the opposite conductivity type and defining a PN junction with said first member;

a third semiconductor member of said one conductivity type defining a PN junction with said second member;
an oxide layer over exposed portions of said junctions and the portions of said members about said exposed portion of said junctions;
electrodes connected to said member; and
means for improving the stability of said device comprising a passivating vitreous film disposed on and coterminous with said layer, said film consisting of an oxide and phosphorous pentoxide and having a thickness of about 500–5000 angstroms.

6. A transistor comprising:
a first semiconductor member of one conductivity type;
a second semiconductor member of the opposite conductivity type nested in said first member and defining a PN junction therewith;
a third semiconductor member of said one conductivity type nested in said second member and defining a PN junction therewith, said members having a coplanar surface and said junctions extending to said surface;
an oxide layer over said junctions, and having spaced apertures therein exposing predetermined portions of at least said second and third member;
means connected to said exposed portions of said second and third members and to said first member for producing an electric field in at least said second and third members and said layer; and
means for improving the stability of said device comprising a passivating vitreous film disposed on and coterminous with said layer, said film consisting of an oxide and phosphorous pentoxide and having a thickness of about 500–5000 angstroms.

7. A field effect transistor comprising:
a semiconductor member having a source region of one conductivity type and a drain region of the same conductivity type as said source region;
an oxide layer located on one surface of said member;
a semiconductor region of opposite conductivity type located between said source region and said drain region;
means for improving the stability of said device comprising a passivating vitreous film disposed on and coterminous with said layer, said film consisting of an oxide and phosphorous pentoxide;
source and drain connections to said source and drain regions, respectively; and
a gate electrode on said film over the surface portion of said region of opposite conductivity type.

8. A semiconductor device comprising:
a semiconductor member and an oxide surface layer;
means for improving the stability of said device comprising a passivating vitreous film disposed on and coterminous with said layer, said film consisting of an oxide and phosphorous pentoxide; and
an additional protective glass layer having a dielectric constant in the range of 3.5–20.7 located on said vitreous film and formed in a non-diffusion operation to protect said vitreous film.

9. A semiconductor device in accordance with claim 8, in which said passivating vitreous film having a thickness of about 500–5000 angstroms.

10. A semiconductor device comprising:
a semiconductor member having a final diffused region of P-type conductivity located therein;
an oxide layer located on one surface of said member;
means coupled to said device for producing an electric field in said member and said layer; and
means for improving the stability of said device comprising a passivating vitreous film disposed on and coterminous with said layer, said film consisting of an oxide and phosphorous pentoxide.

11. A field-effect transistor comprising:
a first semiconductor member of one conductivity type;

spaced second and third members of the opposite conductivity type disposed in said first member and defining PN junctions therewith, said members having a coplanar surface and said junctions extending to said surface;
source and drain connections to said second and third members;
an oxide layer covering said junctions;
a passivating vitreous film of a mixture of the oxide layer and phosphorus pentoxide maintained on said layer at least between said spaced second and third members to provide electrical stability for the transistor; and
an area-type gate electrode on said film between said spaced second and third members.

12. A field-effect transistor in accordance with claim 11 in which said first member is P-type silicon, said second and third members are N-type silicon, and said oxide layer is silicon dioxide.

13. A voltage-sensitive capacitor comprising:
a silicon semiconductor member having a resistivity in the range of 2–5 ohm cm.;
a silicon oxide layer contiguous with a surface portion of said member and having a thickness in the range of 2000–5000 angstroms;
a passivating vitreous film of a mixture of said oxide layer and phosphorus pentoxide maintained in intimate engagement with said layer and having a thickness at leat 500 angstroms;
a first electrode on said film;
a second electrode on said member; and
means for applying between said electrodes a variable voltage in the range of 10–30 volts which is positive on said first electrode to produce an electric field in said member, said layer, and said film and a capacitance between said electrodes having a value which is representative of the magnitude of said voltage and is temperature stable over a range of 25–300° C.

14. A voltage-sensitive capacitor comprising:
a silicon semiconductor member having a thickness of about 5 mils and a resistivity in the range of 2–5 ohm cm.;
a silicon dioxide layer contiguous with a surface portion of said member and having a thickness of about 2000 angstroms;
a passivating vitreous film of a mixture of said oxide layer and phosphorus pentoxide maintained in intimate engagement with said layer and having a thickness of about 500 angstroms;
a first electrode on said film;
a second electrode on said member; and
means for applying between said electrodes a variable voltage in a range up to 30 volts which is positive on said first electrode to produce an electric field in said member, said layer and said film and a capacitance between said electrodes having a value which is representative of the magnitude of said voltage and is temperature stable in operating range up to about 300° C.

References Cited

UNITED STATES PATENTS

| | | | |
|---|---|---|---|
| 2,794,846 | 6/1957 | Fuller | 317—235 |
| 2,804,405 | 8/1957 | Derich et al. | 148—187 |
| 3,200,019 | 8/1965 | Scott et al. | 317—235 |
| 3,200,310 | 8/1965 | Carman | 317—235 |
| 3,204,321 | 9/1965 | Kile | 317—235 |
| 3,206,670 | 9/1965 | Atalla | 317—235 |
| 3,226,611 | 12/1965 | Haenichen | 317—235 |
| 3,226,612 | 12/1965 | Haenichen | 317—235 |

JOHN W. HUCKERT, *Primary Examiner.*

J. D. CRAIG, *Assistant Examiner.*